(12) United States Patent
Isoshima

(10) Patent No.: US 8,754,724 B2
(45) Date of Patent: Jun. 17, 2014

(54) MULTILAYER ELECTRONIC COMPONENT AND MULTILAYER ELECTRONIC COMPONENT MANUFACTURING METHOD

(71) Applicant: Murata Manufacturing Co., Ltd., Nagaokakyo (JP)

(72) Inventor: Tomoshiro Isoshima, Okayama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/690,036

(22) Filed: Nov. 30, 2012

(65) Prior Publication Data

US 2013/0093536 A1 Apr. 18, 2013

Related U.S. Application Data

(63) Continuation of application No. 12/765,083, filed on Apr. 22, 2010, now Pat. No. 8,334,735, which is a continuation of application No. PCT/JP2008/066439, filed on Sep. 11, 2008.

(30) Foreign Application Priority Data

Oct. 23, 2007 (JP) .................................. 2007-275587

(51) Int. Cl.
*H03H 7/09* (2006.01)
*H01P 3/08* (2006.01)

(52) U.S. Cl.
USPC .......................................... 333/185; 333/204

(58) Field of Classification Search
USPC ........................... 333/185, 167, 177, 184, 204
See application file for complete search history.

(56) References Cited

U.S. PATENT DOCUMENTS

| | | | | |
|---|---|---|---|---|
| 5,719,539 A * | 2/1998 | Ishizaki et al. | ................. | 333/204 |
| 5,955,931 A * | 9/1999 | Kaneko et al. | ................. | 333/175 |
| 6,222,427 B1 * | 4/2001 | Kato et al. | ..................... | 333/185 |
| 6,529,101 B2 * | 3/2003 | Tojyo et al. | .................... | 333/175 |
| 7,859,364 B2 * | 12/2010 | Sakisaka et al. | ............... | 333/185 |
| 7,902,941 B2 * | 3/2011 | Ono et al. | ...................... | 333/134 |
| 8,334,735 B2 * | 12/2012 | Isoshima | ....................... | 333/185 |
| 8,451,073 B2 * | 5/2013 | Hoeft et al. | .................... | 333/219 |

OTHER PUBLICATIONS

Isoshima; "Multilayer Electronic Component and Multilayer Electronic Component Manufacturing Method"; U.S. Appl. No. 12/765,083, filed Apr. 22, 2010.

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

A multilayer electronic component and a multilayer electronic component manufacturing method are capable of easily controlling the degree of magnetic field coupling between inductors. Via-hole conductors are arranged so that they extend in a lamination direction in a laminate, and function as a first inductor. Via-hole conductors are arranged so that they extend in the lamination direction in the laminate, and function as a second inductor. A first capacitor and the first inductor define a first resonance circuit. A second capacitor and the second inductor define a second resonance circuit. The via-hole conductors are arranged in a first insulating layer so that they are spaced apart from each other by a first distance. The via-hole conductors are arranged in a second insulating layer so that they are spaced apart from each other by a second distance that is different from the first distance.

19 Claims, 9 Drawing Sheets

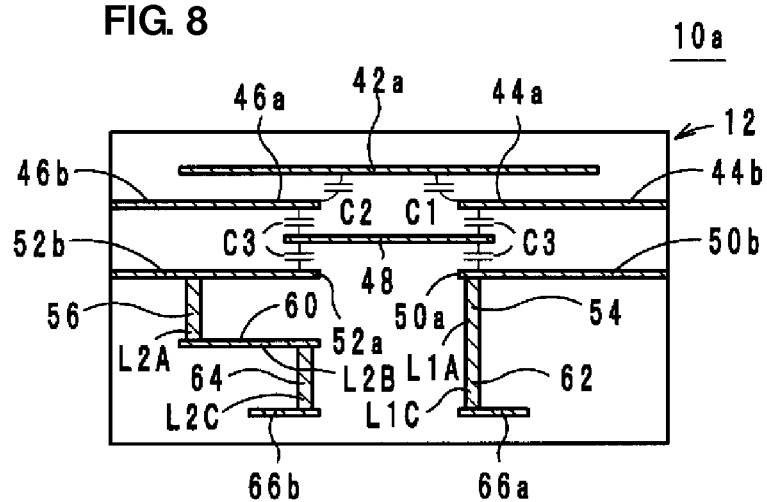

MULTILAYER ELECTRONIC COMPONENT AND MULTILAYER ELECTRONIC COMPONENT MANUFACTURING METHOD

BACKGROUND OF THE INVENTION

1. Field of the Invention

The present invention relates to multilayer electronic components and multilayer electronic component manufacturing methods, and, more particularly, to a multilayer electronic component including a resonance circuit and a multilayer electronic component manufacturing method of manufacturing such a multilayer electronic component.

2. Description of the Related Art

Japanese Unexamined Patent Application Publication No. 09-35936 and Japanese Unexamined Patent Application Publication No. 2002-57543 disclose an electronic component with built-in inductors which uses via-hole conductors as the built-in inductors and a multilayer LC component, respectively. In such an electronic component with built-in inductors and such a multilayer LC component, in order to obtain a desired characteristic, the degree of magnetic field coupling between inductors is controlled by adjusting the distance between a plurality of via-hole conductors or adding a new via-hole conductor.

However, if the distance between these via-hole conductors is adjusted or a new via-hole conductor is added, it is necessary to redesign an electronic component with built-in inductors and a multilayer LC component. This requires a very complicated operation. More specifically, it is necessary to change a punching program for forming a via-hole conductor in a ceramic green sheet included in an electronic component with built-in inductors and a multilayer LC component, reset an apparatus for punching the ceramic green sheet, and manufacture a new metal mold used to punch the ceramic green sheet.

SUMMARY OF THE INVENTION

Preferred embodiments of the present invention provide a multilayer electronic component and a multilayer electronic component manufacturing method capable of easily controlling the degree of magnetic field coupling between inductors.

A multilayer electronic component according to a preferred embodiment of the present invention includes a laminate including a plurality of laminated insulating layers including a first insulating layer and a second insulating layer, a first capacitor and a second capacitor provided in the laminate, a first interlayer connection conductor and a second interlayer connection conductor extending in a lamination direction in the laminate and defining a first inductor, and a third interlayer connection conductor and a fourth interlayer connection conductor extending in the lamination direction in the laminate and defining a second inductor that is coupled to the first inductor by magnetic field coupling; wherein the first capacitor and the first inductor define a first resonance circuit, and the second capacitor and the second inductor define a second resonance circuit, the first interlayer connection conductor and the third interlayer connection conductor are arranged in the first insulating layer so as to be spaced apart from each other by a first distance, and the second interlayer connection conductor and the fourth interlayer connection conductor are arranged in the second insulating layer so as to be spaced apart from each other by a second distance that is different from the first distance.

According to this preferred embodiment of the present invention, since there are two different distances between interlayer connection conductors, it is possible to adjust the average of the length of the first inductor and the length of the second inductor by changing the lengths of the first interlayer connection conductor, the second interlayer connection conductor, the third interlayer connection conductor, and the fourth interlayer connection conductor. As a result, it is possible to control the degree of magnetic field coupling between the first inductor and the second inductor.

In another preferred embodiment of the present invention, only the first interlayer connection conductor and only the third interlayer connection conductor may preferably be provided in a first insulating layer, and only the second interlayer connection conductor and only the fourth interlayer connection conductor may preferably be provided in a second insulating layer.

In another preferred embodiment of the present invention, preferably, the multilayer electronic component may further include a ground electrode provided in the laminate. In the lamination direction, the first capacitor may be located between the first inductor and the ground electrode and the second capacitor may be located between the second inductor and the ground electrode.

In another preferred embodiment of the present invention, preferably, the multilayer electronic component may further include a common electrode provided in the laminate. The first interlayer connection conductor and the second interlayer connection conductor may be electrically connected to each other. The third interlayer connection conductor and the fourth interlayer connection conductor may be electrically connected to each other. The first interlayer connection conductor may be connected to the first capacitor. The third interlayer connection conductor may be connected to the second capacitor. The second interlayer connection conductor and the fourth interlayer connection conductor may be electrically connected to each other via the common electrode.

Preferred embodiments of the present invention can be applied to a multilayer electronic component manufacturing method. More specifically, a multilayer electronic component manufacturing method according to a preferred embodiment of the present invention is a method of manufacturing a multilayer electronic component that includes a first resonance circuit including a first capacitor and a first inductor and a second resonance circuit including a second capacitor and a second inductor. The multilayer electronic component manufacturing method includes a first step of forming a first interlayer connection conductor functioning as the first inductor and a third interlayer connection conductor functioning as the second inductor in a first insulating layer so that they are spaced apart from each other by a first distance, a second step of forming a second interlayer connection conductor functioning as the first inductor and a fourth interlayer connection conductor functioning as the second inductor in a second insulating layer so that they are spaced apart from each other by a second distance that is different from the first distance, and a third step of laminating the first insulating layer and the second insulating layer.

In another preferred embodiment of the present invention, in the third step, the number of the first insulating layers and the number of the second insulating layers may preferably be controlled and then laminated so as to control a characteristic of the multilayer electronic component.

According to various preferred embodiments of the present invention, since there are two different distances between interlayer connection conductors, it is possible to control the degree of magnetic field coupling between the first inductor and the second inductor by changing the lengths of the first interlayer connection conductor and the second interlayer connection conductor, and by changing the lengths of the third interlayer connection conductor and the fourth interlayer connection conductor.

Other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a cross-sectional view of a multilayer electronic component that is an exemplary modification of a multilayer electronic component according to a preferred embodiment of the present invention.

DETAILED DESCRIPTION OF THE PREFERRED EMBODIMENTS

A multilayer electronic component and a multilayer electronic component manufacturing method according to preferred embodiments of the present invention will be described below.

First Preferred Embodiment

Figure 1A:
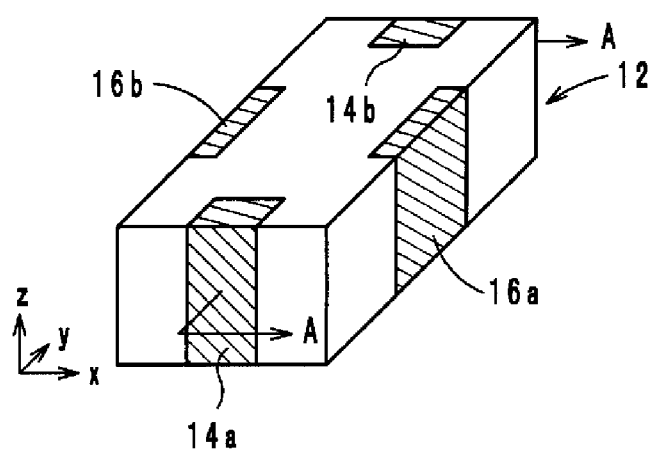
FIG. 1A is a diagram illustrating a multilayer electronic component according to a first preferred embodiment of the present invention as viewed from the upper surface of the multilayer electronic component.
Figure 1B:
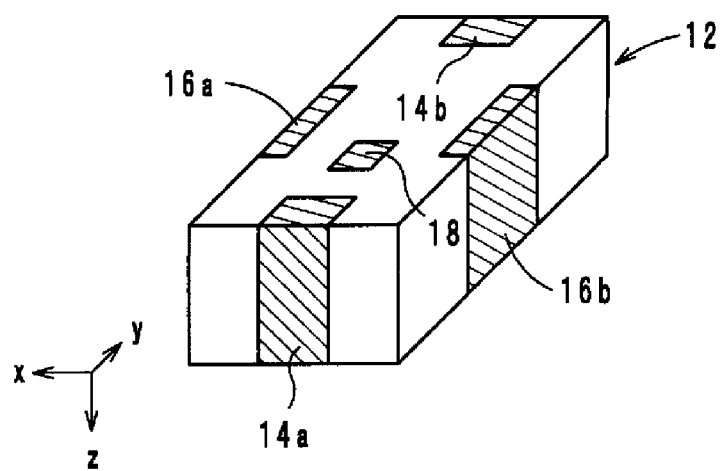
FIG. 1B is a diagram illustrating the multilayer electronic component as viewed from the undersurface of the multilayer electronic component.
Figure 2:
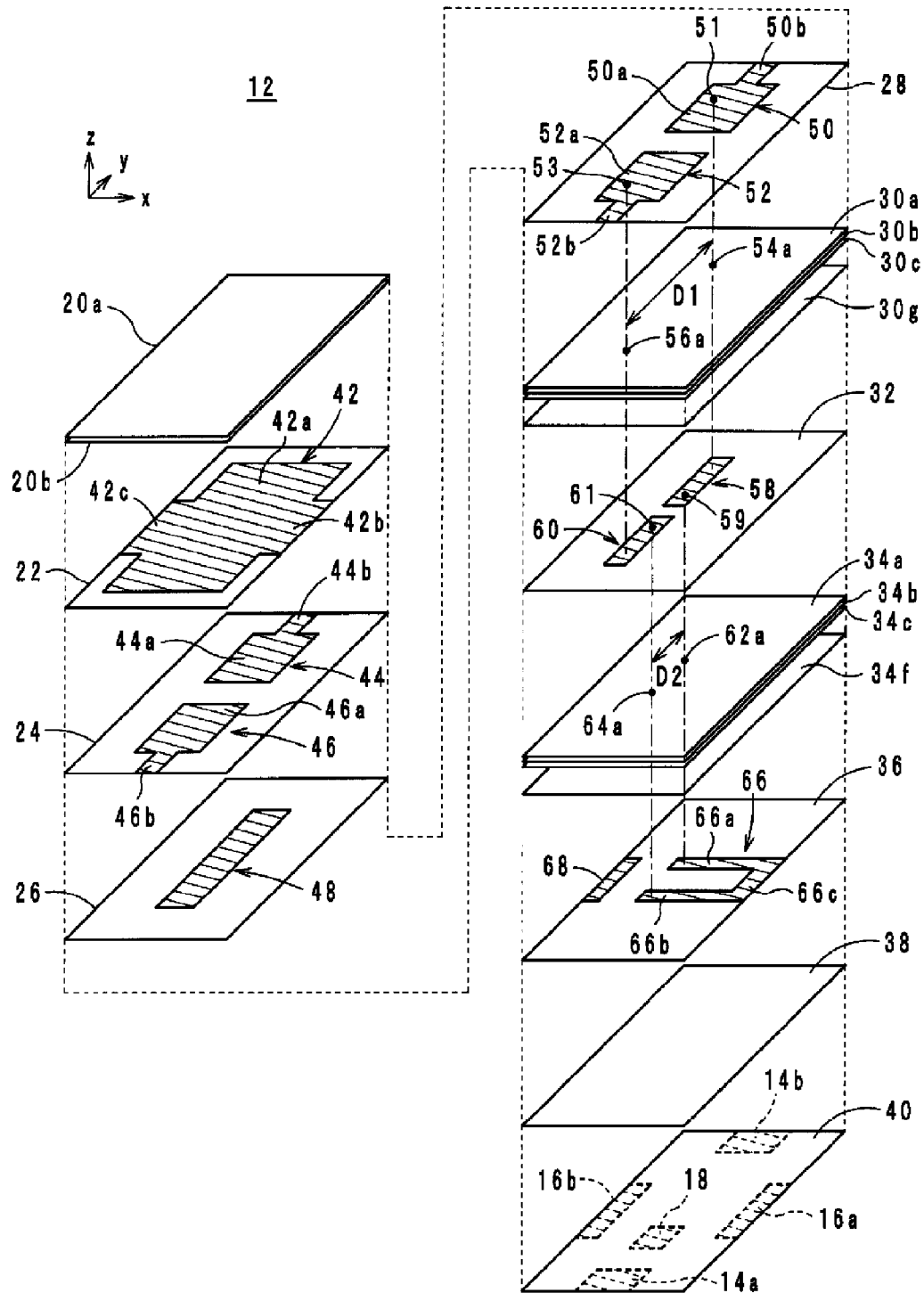
FIG. 2 is an exploded perspective view of the laminate included in the multilayer electronic component illustrated in FIG. 1A.
Figure 3:
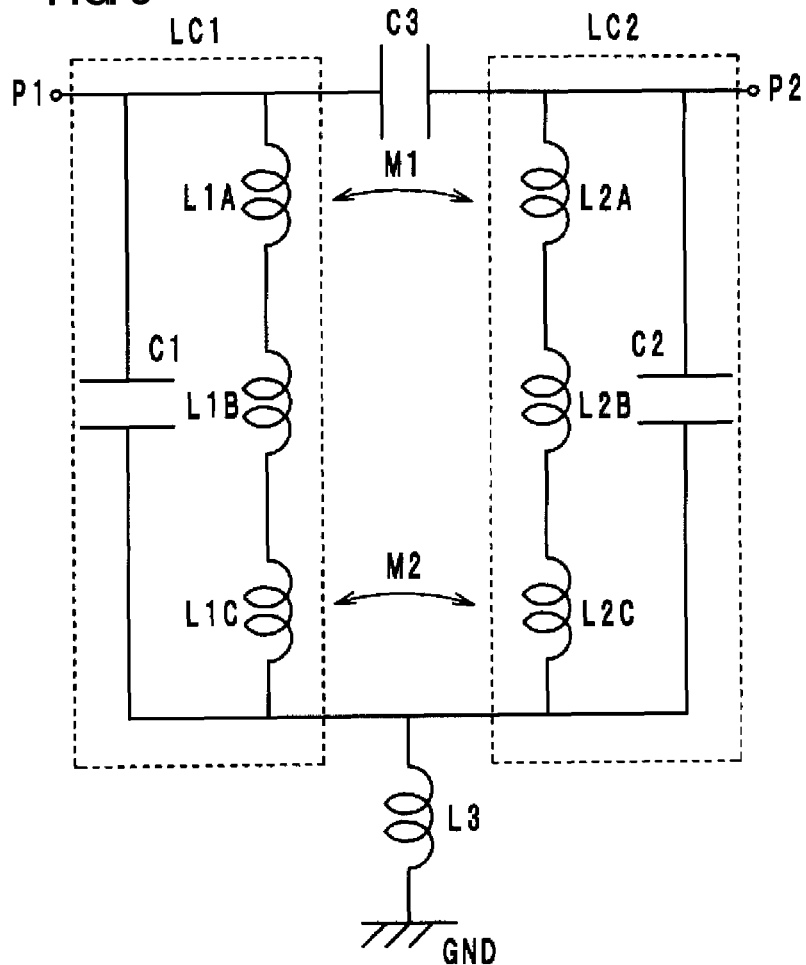
FIG. 3 is an equivalent circuit diagram of the multilayer electronic component.
Figure 4:
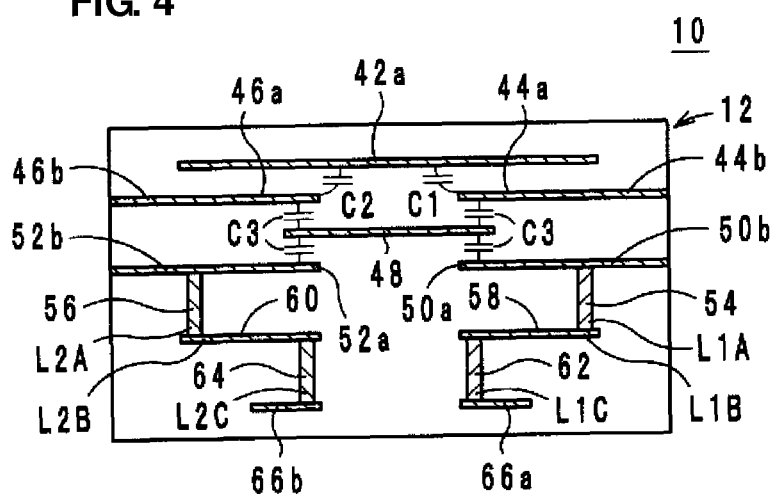
FIG. 4 is a cross-sectional view of the multilayer electronic component taken along the line A-A of FIG. 1A.

A multilayer electronic component according to a first preferred embodiment of the present invention will be described with reference to the accompanying drawings. FIGS. 1A and 1B are external perspective views of a multilayer electronic component according to the first preferred embodiment of the present invention. More specifically, FIG. 1A is a diagram illustrating the multilayer electronic component 10 as viewed from the upper surface of the multilayer electronic component 10. FIG. 1B is a diagram illustrating the multilayer electronic component 10 as viewed from the undersurface of the multilayer electronic component 10. FIG. 2 is an exploded perspective view of a laminate 12 included in the multilayer electronic component 10. FIG. 3 is an equivalent circuit diagram of the multilayer electronic component 10. FIG. 4 is a cross-sectional view of the multilayer electronic component 10 taken along the line A-A illustrated of FIG. 1A. As illustrated in FIGS. 1A and 1B, a widthwise direction on the upper surface of the multilayer electronic component 10 is hereinafter referred to as an x-axis direction, a lengthwise direction on the upper surface of the multilayer electronic component 10 is hereinafter referred to as a y-axis direction, and a lamination direction of the multilayer electronic component 10 is hereinafter referred to as a z-axis direction.

First, the external view of the multilayer electronic component 10 will be described with reference to FIGS. 1A and 1B. The multilayer electronic component 10 includes the laminate 12, an input external electrode 14a, an output external electrode 14b, ground external electrodes 16a and 16b, and an orientation recognition mark 18. The laminate 12 is preferably formed by laminating a plurality of insulating layers, and is preferably a substantially rectangular parallelepiped, for example. In the laminate 12, a plurality of capacitors (not illustrated) and a plurality of inductors (not illustrated) are provided. The input external electrode 14a is provided on an end surface located at an end portion of the laminate 12 in the y-axis direction, and defines a terminal for receiving a signal. The output external electrode 14b is provided on an end surface facing the end surface on which the input external electrode 14a is provided, and defines a terminal for outputting a signal.

The ground external electrode 16a is provided on a side surface located at an end portion of the laminate 12 in the x-axis direction. The ground external electrode 16b is provided on a side surface facing the side surface on which the ground external electrode 16a is provided. The orientation recognition mark 18 is formed on the undersurface of the laminate 12, and is used to recognize the orientation of the multilayer electronic component 10.

Next, the inner structure of the laminate 12 will be described with reference to FIGS. 2 to 4. As illustrated in FIG. 2, in the laminate 12, insulating layers 20a, 20b, 22, 24, 26, 28, 30a to 30g, 32, 34a to 34f, 36, 38, and 40 are laminated so that these insulating layers are arranged in this order from top to bottom (the insulating layers 30d to 30f, 34d, and 34e are not illustrated). If the insulating layers 30a to 30g and 34a to 34f are referred to individually, then the insulating layers 30a to 30g and 34a to 34f are used. If the insulating layers 30a to 30g and the insulating layers 34a to 34f are referred to collectively, then the insulating layers 30 and 34 are used, respectively.

No component is formed on the main surfaces of the insulating layers 20a and 20b. An internal electrode 42 is formed on the main surface of the insulating layer 22. The internal electrode 42 includes a capacitor electrode 42a and extraction electrodes 42b and 42c. The capacitor electrode 42a is preferably a rectangular or substantially rectangular electrode provided on the main surface of the insulating layer 22, and defines one electrode of capacitors C1 and C2 as illustrated in FIGS. 3 and 4. One end of the extraction electrode 42b is connected to the capacitor electrode 42a, and the other end of the extraction electrode 42b is connected to the ground external electrode 16a illustrated in FIGS. 1A and 1B. One end of the extraction electrode 42c is connected to the capacitor electrode 42a, and the other end of the extraction electrode 42c is connected to the ground external electrode 16b illustrated in FIGS. 1A and 1B. Therefore, the internal electrode 42 also defines a ground electrode.

Internal electrodes 44 and 46 are provided on the main surface of the insulating layer 24. The internal electrode 44 includes a capacitor electrode 44a and an extraction electrode 44b. The capacitor electrode 44a is preferably a rectangular or substantially rectangular electrode formed on the main surface of the insulating layer 24 so that it faces the capacitor electrode 42a, and defines the other electrode of the capacitor C1 as illustrated in FIGS. 3 and 4. Furthermore, the capacitor electrode 44a also functions as one electrode of a capacitor C3. One end of the extraction electrode 44b is connected to the capacitor electrode 44a, and the other end of the extraction electrode 44b is connected to the output external electrode 14b illustrated in FIG. 1A.

The internal electrode 46 includes a capacitor electrode 46a and an extraction electrode 46b. The capacitor electrode 46a is preferably a rectangular or substantially rectangular electrode provided on the main surface of the insulating layer 24 so that it faces the capacitor electrode 42a, and functions as the other electrode of the capacitor C2 as illustrated in FIGS. 3 and 4. Furthermore, the capacitor electrode 46a also functions as the other electrode of the capacitor C3. That is, the capacitor electrodes 44a and 46a define the capacitor C3. One end of the extraction electrode 46b is connected to the capacitor electrode 46a, and the other end of the extraction electrode 46b is connected to the input external electrode 14a illustrated in FIGS. 1A and 1B.

An internal electrode (capacitor electrode) 48 is provided on the main surface of the insulating layer 26. The capacitor electrode 48 is preferably a rectangular or substantially rectangular electrode arranged on the main surface of the insulating layer 26 so that it faces the capacitor electrodes 44a and 46a, and functions as a portion of the capacitor C3 as illustrated in FIGS. 3 and 4.

Internal electrodes 50 and 52 are provided on the main surface of the insulating layer 28. The internal electrode 50 includes a capacitor electrode 50a and an extraction electrode 50b. The capacitor electrode 50a is preferably a rectangular or substantially rectangular electrode provided on the main surface of the insulating layer 28, and functions as one electrode of the capacitor C3 as illustrated in FIGS. 3 and 4. One end of the extraction electrode 50b is connected to the capacitor electrode 50a, and the other end of the extraction electrode 50b is connected to the output external electrode 14b illustrated in FIG. 1A.

The internal electrode 52 includes a capacitor electrode 52a and an extraction electrode 52b. The capacitor electrode 52a is preferably a rectangular or substantially rectangular electrode provided on the main surface of the insulating layer 28, and functions as the other electrode of the capacitor C3 as illustrated in FIGS. 3 and 4. That is, the capacitor electrodes 50a and 52a define the capacitor C3. One end of the extraction electrode 52b is connected to the capacitor electrode 52a, and the other end of the extraction electrode 52b is connected to the input external electrode 14a illustrated in FIG. 1A.

In addition, via-hole conductors 51 and 53 are provided in the insulating layer 28. The via-hole conductors 51 and 53 are directly connected to the capacitor electrodes 50a and 52a, respectively.

In the insulating layers 30a to 30g, via-hole conductors 54a to 54g and via-hole conductors 56a to 56g are provided, respectively (the via-hole conductors 54b to 54g and 56b to 56g are not illustrated). The insulating layers 30a to 30g preferably have the same or substantially the same structure. By laminating the insulating layers 28 and 30a to 30g, the via-hole conductors 51 and 54a to 54g are formed as a first interlayer connection conductor extending in the lamination direction in the laminate 12, and function as an inductor L1A as illustrated in FIGS. 3 and 4. By laminating the insulating layers 28 and 30a to 30g, the via-hole conductors 53 and 56a to 56g are formed as a third interlayer connection conductor extending in the lamination direction in the laminate 12, and function as an inductor L2A as illustrated in FIGS. 3 and 4. In order to represent via-hole conductors formed on the insulating layers 30a to 30g, the via-hole conductors 54a to 54g and the via-hole conductors 56a to 56g are used, respectively. In order to represent a via-hole conductor obtained by connecting the via-hole conductors 51 and 54a to 54g to each other and a via-hole conductor obtained by connecting the via-hole conductors 53 and 56a to 56g to each other, via-hole conductors 54 and 56 are used, respectively.

Furthermore, the via-hole conductors 51 and 54a to 54g and the via-hole conductors 53 and 56a to 56g are provided in the insulating layers 28 and 30a to 30g so that they are spaced apart from each other by a first distance D1, respectively. Only the via-hole conductors 54a to 54g and only the via-hole conductors 56a to 56g are respectively formed in the insulating layers 30a to 30g.

Internal electrodes 58 and 60 are provided on the main surface of the insulating layer 32. The internal electrode 58 is preferably a rectangular or substantially rectangular electrode formed on the main surface of the insulating layer 32, and is connected to the via-hole conductor 54. The internal electrode is preferably a rectangular or substantially rectangular electrode provided on the main surface of the insulating layer 32, and is connected to the via-hole conductor 56.

Furthermore, via-hole conductors 59 and 61 are provided in the insulating layer 32. The via-hole conductors 59 and 61 are connected to the internal electrodes 58 and 60, respectively. As illustrated in FIGS. 3 and 4, the internal electrodes 58 and 60 are used to shift the positions of inductors L1C and L2C electrically connected to the inductors L1A and L2A so that the inductors L1C and L2C and the inductors L1A and L2A are not respectively aligned, in an x-y plane. As illustrated in FIGS. 3 and 4, the internal electrodes 58 and 60 also function as inductors L1B and L2B, respectively.

In the insulating layers 34a to 34f, via-hole conductors 62a to 62f and via-hole conductors 64a to 64f are formed, respectively (the via-hole conductors 62b to 62f and 64b to 64f are not illustrated). The insulating layers 34a to 34f have the same or substantially the same structure. By laminating the insulating layers 32 and 34a to 34f, the via-hole conductors 59 and 62a to 62f define a second interlayer connection conductor extending in the lamination direction in the laminate and function as the inductor L1C. By laminating the insulating layers 32 and 34a to 34f, the via-hole conductors 61 and 64a to 64f define a fourth interlayer connection conductor extending in the lamination direction in the laminate 12 and function as the inductor L2C. In order to refer to via-hole conductors formed on the insulating layers 34a to 34f, the via-hole conductors 62a to 62f and the via-hole conductors 64a to 64f are used, respectively. In order to refer to a via-hole conductor obtained by connecting the via-hole conductors 59 and 62a to 62f to each other and a via-hole conductor obtained by connecting the via-hole conductors 61 and 64a to 64f to each other, via-hole conductors 62 and 64 are used, respectively.

Furthermore, the via-hole conductors 59 and 62a to 62f and the via-hole conductors 61 and 64a to 64f are arranged on the insulating layers 32 and 34a to 34f so that they are spaced apart from each other by a second distance D2 that is preferably shorter than the first distance D1, respectively. In the insulating layers 34a to 34f, only the via-hole conductors 62a to 62f and only the via-hole conductors 64a to 64f are respectively provided.

Internal electrodes 66 and 68 are provided on the main surface of the insulating layer 36. The internal electrode 66 includes inductor electrodes 66a and 66b and an extraction electrode 66c, and functions as a common electrode. Each of the inductor electrodes 66a and 66b is preferably a rectangular or substantially rectangular electrode provided on the main surface of the insulating layer 36, and functions as an inductor L3 along with the ground external electrode 16b. An end of each of the inductor electrodes 66a and 66b is connected to the via-hole conductors 62 and 64, respectively. Ends of the extraction electrode 66c are connected to the inductor electrodes 66a and 66b, and the other end of the extraction electrode 66c is connected to the ground external electrode 16a. As a result, the inductors L1C and L2C are electrically connected to each other via the internal electrode 66.

The internal electrode 68 is arranged along a side facing a side at which the extraction electrode 66c is provided. The internal electrode 68 is arranged so that it is spaced apart from the inductor electrodes 66a and 66b by a predetermined distance, and one end of the internal electrode 68 is connected to the ground external electrode 16b.

No component is formed or provided on the main surface of the insulating layer 38. The orientation recognition mark 18 and portions of the input external electrode 14a, the output external electrode 14b, and the ground external electrodes 16a, 16b are formed on the undersurface of the insulating layer 40.

By laminating the insulating layers 20a, 20b, 22, 24, 26, 28, 30a to 30g, 32, 34a to 34f, 36, 38, and 40 having the above-described structure, the multilayer electronic component having an equivalent circuit illustrated in FIG. 3 and a cross sectional structure illustrated in FIG. 4 is obtained.

The equivalent circuit illustrated in FIG. 3 will be described. The equivalent circuit of the multilayer electronic component 10 includes the capacitors C1, C2, and C3, the inductors L1A, L1B, L1C, L2A, L2B, L2C, and L3, an input terminal P1, and an output terminal P2, and defines a band-pass filter. The input terminal P1 corresponds to the input external electrode 14a illustrated in FIGS. 1A and 1B, and the output terminal P2 corresponds to the output external electrode 14b illustrated in FIGS. 1A and 1B.

The capacitor C1 and the inductors L1A, L1B, and L1C are connected in parallel with each other, so that a resonance circuit LC1 is provided. The capacitor C2 and the inductors L2A, L2B, and L2C are connected in parallel with each other, so that a resonance circuit LC2 is provided. One end of the resonance circuit LC1 is connected to the input terminal P1, and the other end of the resonance circuit LC1 is connected to the inductor L3. One end of the resonance circuit LC2 is connected to the output terminal P2, and the other end of the resonance circuit LC2 is connected to the inductor L3. One end of the inductor L3 is connected to the ground. The other end of the inductor L3 corresponds to the ground external electrodes 16a and 16b. Furthermore, between the input terminal P1 and the output terminal P2, the capacitor C3 arranged to couple the resonance circuits LC1 and LC2 to each other is disposed.

In the multilayer electronic component 10 having the above-described structure, a mutual inductance M1 is generated between the inductors L1A and L2A, and a mutual inductance M2 is generated between the inductors L1C and L2C. As a result, the resonance circuits LC1 and LC2 are coupled to each other by magnetic field coupling. The degree of magnetic field coupling between the resonance circuits LC1 and LC2 depends on the lengths of the via-hole conductors 54, 56, 62, and 64 illustrated in FIGS. 2 and 4 and the distances D1 and D2 illustrated in FIG. 2. Accordingly, in the multilayer electronic component 10, by controlling the number of the insulating layers 30 and the number of the insulating layers 34, a band-pass filter having a desired characteristic can be obtained. The processing for controlling the number of the insulating layers 30 and the number of the insulating layers 34 will be described below.

Next, a method of manufacturing the multilayer electronic component 10 will be described with reference to FIGS. 1A, 1B, and 2.

First, ceramic green sheets used for the insulating layers 20a, 20b, 22, 24, 26, 28, 30a to 30g, 32, 34a to 34f, 36, 38, and 40 are created. For example, materials such as aluminum oxide ($Al_2O_3$), silicon oxide ($SiO_2$), barium oxide ($BaO_2$), zirconium oxide ($ZrO_2$), and boron oxide ($B_2O_3$) are preferably weighed at an appropriate ratio so as to obtain desired characteristics such as a magnetic permeability and a dielectric constant, are input into a ball mill as raw materials, and are subjected to wet blending. Subsequently, an obtained mixture is dried and is then ground, and an obtained powder is calcined for about 1 to about 2 hours at about 800° C. to about 900° C. The calcined powder is subjected to wet grinding in the ball mill, and is then dried and disintegrated. As a result, ceramic powder is obtained.

A binding agent (for example, vinyl acetate or water-soluble acrylic), a plasticizing agent, a wetting agent, and a dispersing agent are preferable mixed with the ceramic powder in the ball mill. Subsequently, an obtained mixture is subjected to defoaming by decompression, so that ceramic slurry is obtained. The ceramic slurry is formed into the shape of a sheet using the doctor blade method, for example, and is then dried, so that a ceramic green sheet having a desired film thickness is obtained.

Subsequently, in the insulating layers 28 and 30a to 30g defined by ceramic green sheets, the via-hole conductors 51 and 54a to 54g and the via-hole conductors 53 and 56a to 56g, which are illustrated in FIG. 2, are formed so that they are spaced apart from each other by the first distance D1. More specifically, a through-hole is formed in a ceramic green sheet preferably using laser beam, for example, and conductive paste preferably including Ag, Pd, Cu, Au, or an alloy thereof, for example, is then filled in the through-hole by printing or other suitable method, so that the via-hole conductors 51, 54a to 54g, 53, and 56a to 56g are formed.

Subsequently, in the insulating layers 32 and 34a to 34f defined by ceramic green sheets, the via-hole conductors 59 and 62a to 62f and the via-hole conductors 61 and 64a to 64f, which are illustrated in FIG. 2, are formed so that they are spaced apart from each other by the second distance D2. The detailed method of forming the via-hole conductors 59, 61, 62a to 62f, and 64a to 64f is the same or substantially the same as the detailed method of forming the via-hole conductors 51, 53, 54a to 54g, and 56a to 56g, and the description thereof is therefore omitted.

Subsequently, on the main surfaces of the insulating layers 22, 24, 26, 28, 32, and 36, conductive paste is applied by screen printing, photolithography, or other suitable method, so that the internal electrodes 42, 44, 46, 48, 50, 52, 58, 60, 66, and 68 are formed. Furthermore, using a similar method, on the main surface of the insulating layer 40 defined by a ceramic green sheet, the orientation recognition mark 18 and portions of the input external electrode 14a, the output external electrode 14b, and the ground external electrodes 16a, 16b are formed.

Subsequently, an uncalcined mother laminate is formed by laminating the ceramic green sheets. At that time, in order to obtain a band-pass filter having desired characteristics (such as a bandwidth and an attenuation characteristic), the lengths of the via-hole conductors 54, 56, 62, and 64 are adjusted by changing the number of the insulating layers 30 and the number of the insulating layers 34. A predetermined number of ceramic green sheets are temporarily press-bonded. After the temporary press bonding of these ceramic green sheets has been completed, the full press bonding of the mother laminate is performed using a hydrostatic press or other suitable machine.

Subsequently, the uncalcined mother laminate is cut into separate laminates by a dicing machine or other suitable machine, so that rectangular or substantially rectangular parallelepiped laminates are obtained.

Subsequently, the laminates are subjected to binder removing processing and calcination, so that a calcined laminate 12 is obtained.

Subsequently, using a known method, such as a dipping method, for example, the surface of the laminate 12 is subjected to the application of electrode paste preferably including silver, copper, or palladium as a main component, for example, and baking, so that a silver, copper, or palladium electrode, for example, having the shape illustrated in FIG. 1A is formed.

Finally, the surface of the baked silver, copper, or palladium electrode, for example, is preferably subjected to Ni plating and Sn plating or to Ni plating and solder plating, for example, so that the input external electrode 14a, the output external electrode 14b, the ground external electrodes 16a and 16b, and the orientation recognition mark 18 are formed. After the above-described process has been performed, the multilayer electronic component 10 illustrated in FIG. 1A is manufactured.

Although a sheet lamination method has been described, a method of manufacturing the multilayer electronic component 10 is not limited thereto. For example, the multilayer electronic component 10 may be manufactured using a printing lamination method or a transfer lamination method.

With the multilayer electronic component 10 and the method of manufacturing the multilayer electronic component 10 according to preferred embodiments of the present invention, it is possible to easily change the degree of coupling between the inductors L1A and L2A and the degree of coupling between the inductors L1C and L2C, and to easily obtain the multilayer electronic component 10 having various characteristics. The detailed description thereof will be made below.

In the electronic component including built-in inductors disclosed in Japanese Unexamined Patent Application Publication No. 09-35936 and the multilayer LC component disclosed in Japanese Unexamined Patent Application Publication No. 2002-57543, in order to provide various characteristics for the electronic component with the built-in inductors and the multilayer LC component, the degree of magnetic field coupling between the inductors is changed using a method of adjusting the distance between via-hole conductors or a method of adding a via-hole conductor. However, if these methods are used, it is necessary to redesign the electronic component with built-in inductors and the multilayer LC component. This requires a very complicated operation. More specifically, it is necessary to change a punching program for forming a via-hole conductor in a ceramic green sheet included in the electronic component with built-in inductors and the multilayer LC component, reset an apparatus for punching the ceramic green sheet, and create a new metal mold used to punch the ceramic green sheet.

To the contrary, with the multilayer electronic component 10 and the method of manufacturing the multilayer electronic component 10 according to preferred embodiments of the present invention, merely by controlling the number of the insulating layers 30 to be laminated and the number of the insulating layers 34 to be laminated, it is possible to adjust the lengths of the via-hole conductors 54, 56, 62, and 64 and control the degree of coupling between the inductors L1A and L2A and the degree of coupling between the inductors L1C and L2C. Accordingly, if the number of the insulating layers 30 and the number of the insulating layers 34 are controlled, the multilayer electronic component 10 having a plurality of different characteristics can be obtained. An example of the method of manufacturing the multilayer electronic component 10 will be described with reference to Table 1 and FIGS. 5A to 5C.

TABLE 1

| | | the number of insulating layers | | |
|---|---|---|---|---|
| insulating layer | thickness (μm) | first pattern | second pattern | third pattern |
| insulating layer 20 | 25 | 2 | 2 | 2 |
| insulating layer 22 | 25 | 1 | 1 | 1 |
| insulating layer 24 | 25 | 1 | 1 | 1 |
| insulating layer 26 | 25 | 1 | 1 | 1 |
| insulating layer 28 | 25 | 1 | 1 | 1 |
| insulating layer 30 | 25 | 11 | 7 | 3 |
| insulating layer 32 | 25 | 1 | 1 | 1 |
| insulating layer 34 | 25 | 2 | 6 | 10 |
| insulating layer 36 | 25 | 1 | 1 | 1 |
| insulating layer 38 | 40 | 1 | 1 | 1 |
| insulating layer 40 | 25 | 1 | 1 | 1 |
| magnetic field coupling degree | | small | normal | large |

Figure 5A:
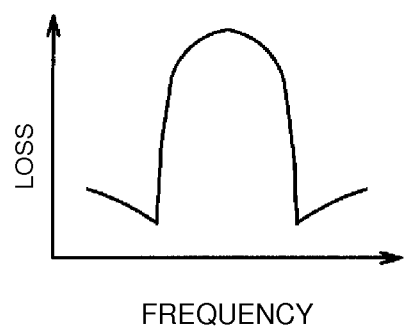
FIG. 5A is a graph illustrating the loss characteristic of the first pattern of the multilayer electronic component.
Figure 5B:
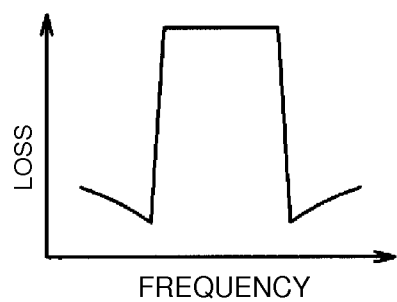
FIG. 5B is a graph illustrating the loss characteristic of the second pattern of the multilayer electronic component.
Figure 5C:
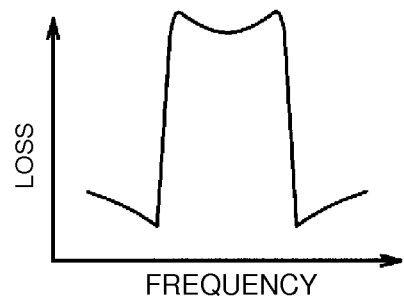
FIG. 5C is a graph illustrating the loss characteristic of the third pattern of the multilayer electronic component.

Table 1 indicates the degree of magnetic field coupling between the inductors L1A and L2A and the degree of magnetic field coupling between the inductors L1C and L2C, when the number of the insulating layers 30 and the number of the insulating layers 34 vary among three different values while the total number of insulating layers is not changed. More specifically, in the first pattern of the multilayer electronic component 10, the eleven insulating layers 30 and the two insulating layers 34 are laminated. In the second pattern of the multilayer electronic component 10, the seven insulating layers 30 and the six insulating layers 34 are laminated. The multilayer electronic component 10 illustrated in FIG. 2 corresponds to the second pattern of the multilayer electronic component 10. In the third pattern of the multilayer electronic component 10, the three insulating layers 30 and the ten insulating layers 34 are laminated. FIG. 5A is a graph illustrating the loss characteristic of the first pattern of the multilayer electronic component 10. FIG. 5B is a graph illustrating the loss characteristic of the second pattern of the multilayer electronic component 10. FIG. 5C is a graph illustrating the loss characteristic of the third pattern of the multilayer electronic component 10. In these graphs, a vertical axis represents a loss, and a horizontal axis represents a frequency.

If the lengths of the via-hole conductors 54, 56, 62, and 64 in the second pattern of the multilayer electronic component 10 are standard lengths, the length of the via-hole conductors 54 and 56 between which there is a relatively large gap is relatively long and the length of the via-hole conductors 62 and 64 between which there is a relatively small gap is relatively short in the first pattern of the multilayer electronic component 10. Accordingly, the average distance between the inductors L1A, L1C and the inductors L2A, L2C in the first pattern of the multilayer electronic component 10 is greater than the average distance between the inductors L1A, L1C and the inductors L2A, L2C in the second pattern of the multilayer electronic component 10. As a result, as shown in Table 1, the degree of magnetic field coupling of the first pattern of the multilayer electronic component 10 is less than that of the second pattern of the multilayer electronic component 10. Accordingly, as illustrated in FIGS. 5A and 5B, the first pattern of the multilayer electronic component 10 is a band-pass filter having a filter characteristic of a narrower band than that of the second pattern of the multilayer electronic component 10.

On the other hand, in the third pattern of the multilayer electronic component 10, the length of the via-hole conductors 54 and 56 between which there is a relatively large gap is relatively short and the length of the via-hole conductors 62 and 64 between which there is a relatively small gap is relatively long. Accordingly, the average distance between the inductors L1A, L1C and the inductors L2A, L2C in the third pattern of the electronic component 10 is less than the average distance between the inductors L1A, L1C and the inductors L2A, L2C in the second pattern of the multilayer electronic component 10. As a result, as shown in Table 1, the degree of magnetic field coupling of the third pattern of the multilayer electronic component 10 is greater than that of the second pattern of the multilayer electronic component 10. Accordingly, as illustrated in FIGS. 5B and 5C, the third pattern of the multilayer electronic component 10 is a band-pass filter having a filter characteristic of a wider band than that of the second pattern of the multilayer electronic component 10.

Figure 6:
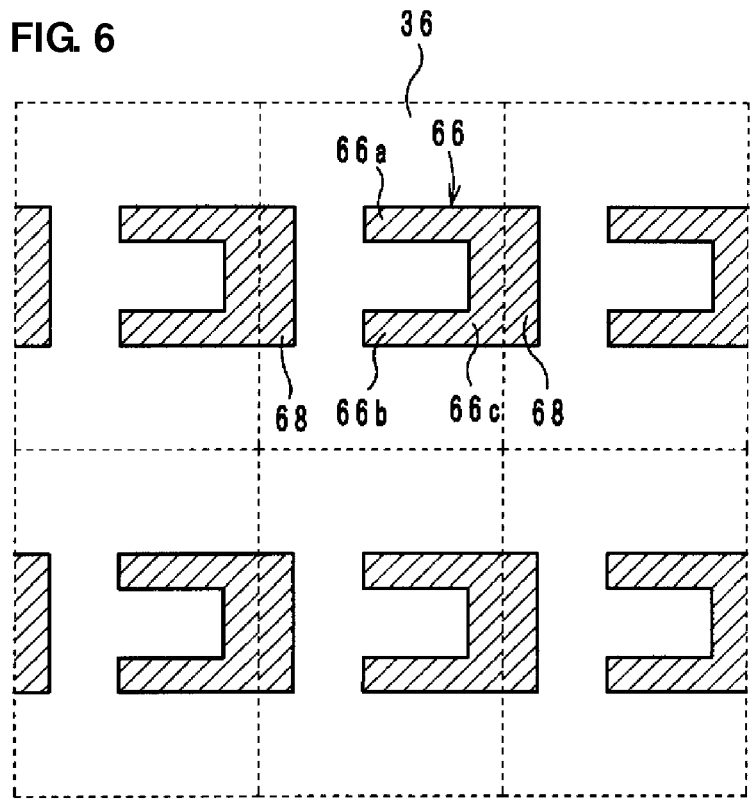
FIG. 6 is a diagram illustrating a ceramic green sheet used as an insulating layer.

In the multilayer electronic component 10, since the internal electrode 68 is disposed as illustrated in FIG. 2, it is possible to prevent variations in the potentials of the inductor electrodes 66a and 66b. Descriptions thereof will be made below with reference to FIG. 6. FIG. 6 is a diagram illustrating a ceramic green sheet used as the insulating layer 36.

If the internal electrode 68 is not present, the potentials of the inductor electrodes 66a and 66b are most strongly affected by the potential of the ground external electrode 16b that is nearest to the inductor electrodes 66a and 66b. Since the ground external electrode 16b is preferably formed by screen printing or other suitable method, a position at which the ground external electrode 16b is formed varies within the margin of a manufacturing error. Furthermore, positions at which the inductor electrodes 66a and 66b are formed vary within the margin of a manufacturing error. Consequently, the distance between the ground external electrode 16b and each of the inductor electrodes 66a and 66b varies, resulting in variations in the effect of the potential of the ground external electrode 16b on the potentials of the inductor electrodes 66a and 66b.

In the multilayer electronic component 10, the internal electrode 68 to which a ground potential is applied is located at a position spaced apart from the inductor electrodes 66a and 66b by a predetermined distance. As a result, the potentials of the inductor electrodes 66a and 66b are most strongly affected by the potential of the internal electrode 68. Accordingly, the inductor electrodes 66a and 66b are not easily affected by the ground external electrodes 16a and 16b.

Furthermore, as illustrated in FIG. 6, the internal electrodes 68 that are individually connected to the internal electrodes 66 are preferably formed at predetermined intervals by screen printing or other suitable method on a ceramic green sheet. Subsequently, the ceramic green sheet is cut, so that the internal electrodes 66 are individually separated from the internal electrodes 68. Accordingly, even if the cut positions of the ceramic green sheet are changed, the distance between the internal electrodes 66 (each of the inductor electrodes 66a and 66b) and the internal electrodes 68 is not changed. As a result, variations in the effect of the potential of the internal electrode 68 on the potential of the internal electrode 66 are not significantly produced.

Figure 7:
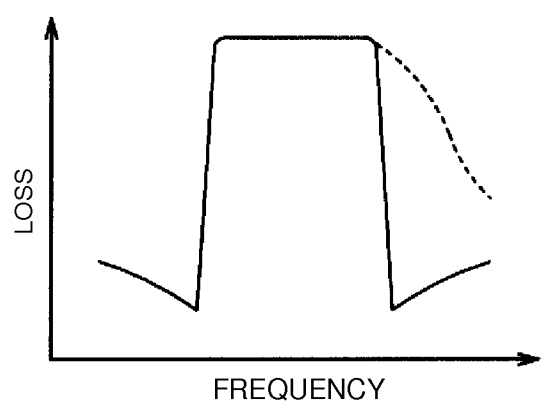
FIG. 7 is a graph illustrating the loss characteristic of the multilayer electronic component.

In the multilayer electronic component 10, the capacitor C3 is provided. Thus, by forming the capacitor C3, it is possible to abruptly change both ends of a loss characteristic (to generate attenuation poles) as illustrated in FIG. 7 that is a graph indicating the loss characteristic of the multilayer electronic component 10. As a result, the multilayer electronic component 10 having a narrow-band filter characteristic can be obtained.

Furthermore, in the multilayer electronic component 10, the inductor L3 is formed. By controlling the inductance of the inductor L3, it is possible to change the frequency of an attenuation pole on a higher frequency side from a dotted line to a solid line in the loss characteristic graph illustrated in FIG. 7.

Still furthermore, in the z-axis direction in the multilayer electronic component 10, the capacitor C1 is disposed between the internal electrode 42 and each of the inductors L1A to L1C, and the capacitor C2 is disposed between the internal electrode 42 and each of the inductors L2A to L2C. As a result, as will be described below, a decrease in filter insertion loss is prevented. More specifically, if the multilayer electronic component 10 is disposed on a substrate so that the substrate is closer to the capacitor electrodes 44a and 46a than to the internal electrode 42, the capacitor electrodes 44a and 46a are disposed under the internal electrode 42 and do not function as an antenna. Accordingly, the emission of a signal from the capacitor electrodes 44a and 46a is prevented, and a decrease in filter insertion loss is prevented.

The present invention is not limited to the multilayer electronic component 10 according to the above-described preferred embodiments. Various changes can be made to the multilayer electronic component 10 without departing from the spirit and scope of the present invention.

As the multilayer electronic component 10, not only a band-pass filter but also a low-pass filter, a high-pass filter, or other suitable component may be used. Alternatively, the multilayer electronic component 10 may be a duplexer defined by a combination of band-pass filters, a low-pass filter, a high-pass filter, a trap circuit, or a duplexer defined by a combination of these different types of circuits. Alternatively, the multilayer electronic component 10 may also be a triplexer or multiplexer including a plurality of filters in a single laminate or a triplexer or multiplexer including a filter and another circuit. Alternatively, the multilayer electronic component 10 may be a coupler including a band-pass filter in which inductors formed by via-hole conductors and a coupling line are formed in an insulating layer lamination direction.

In the multilayer electronic component 10, in order to adjust the length of the via-hole conductors 54 and 56 and the length of the via-hole conductors 62 and 64, the number of the insulating layers 30 and the number of the insulating layers 34 are preferably respectively controlled. However, a method of adjusting the length of the via-hole conductors 54 and 56 and the length of the via-hole conductors 62 and 64 is not limited thereto. For example, in order to adjust the length of the via-hole conductors 54 and 56 and the length of the via-hole conductors 62 and 64, the thickness of the insulating layer 30 and the thickness of the insulating layer 34 may preferably be respectively adjusted.

FIG. 8 is a cross-sectional view of a multilayer electronic component 10a that is an exemplary modification of a multilayer electronic component according to a preferred embodiment of the present invention. As illustrated in the multilayer electronic component 10a in FIG. 8, the via-hole conductors 54 and 62 may preferably be aligned. In this case, the internal electrode 58 is not required. In the multilayer electronic component 10a, it is not necessary to shift the position of the via-hole conductor 62 using the internal electrode 58 so that the via-hole conductors 54 and 62 are not aligned. This eliminates the problem of a disconnection between the via-hole conductors 54 and 62.

Second Preferred Embodiment

Figure 9A:
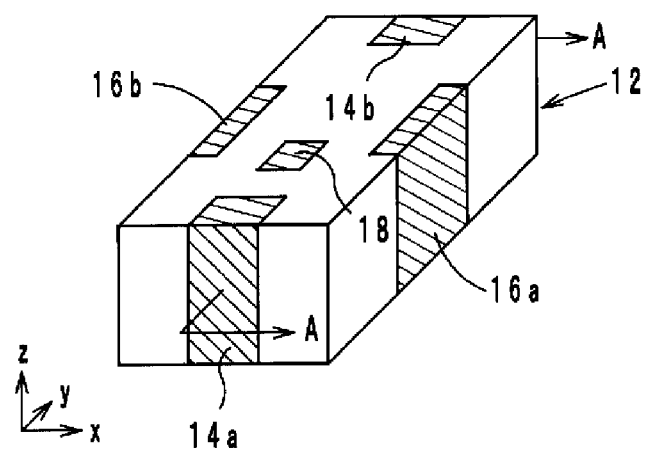
FIG. 9A is a diagram illustrating a multilayer electronic component according to a second preferred embodiment of the present invention as viewed from the upper surface of the multilayer electronic component.
Figure 9B:
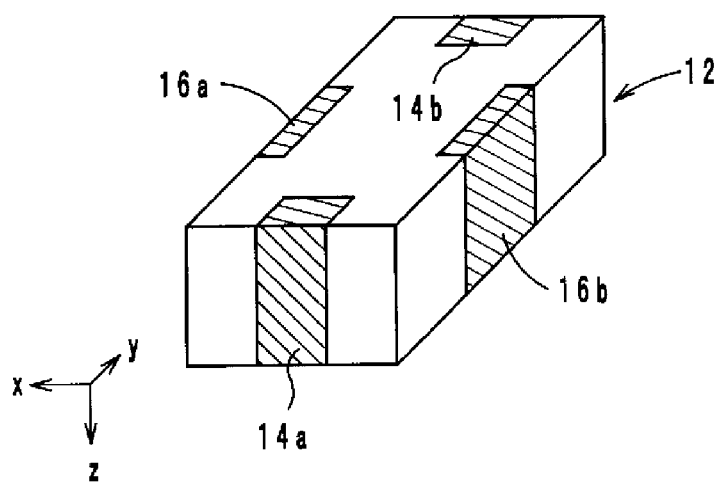
FIG. 9B is a diagram illustrating the multilayer electronic component as viewed from the undersurface of the multilayer electronic component.
Figure 10:
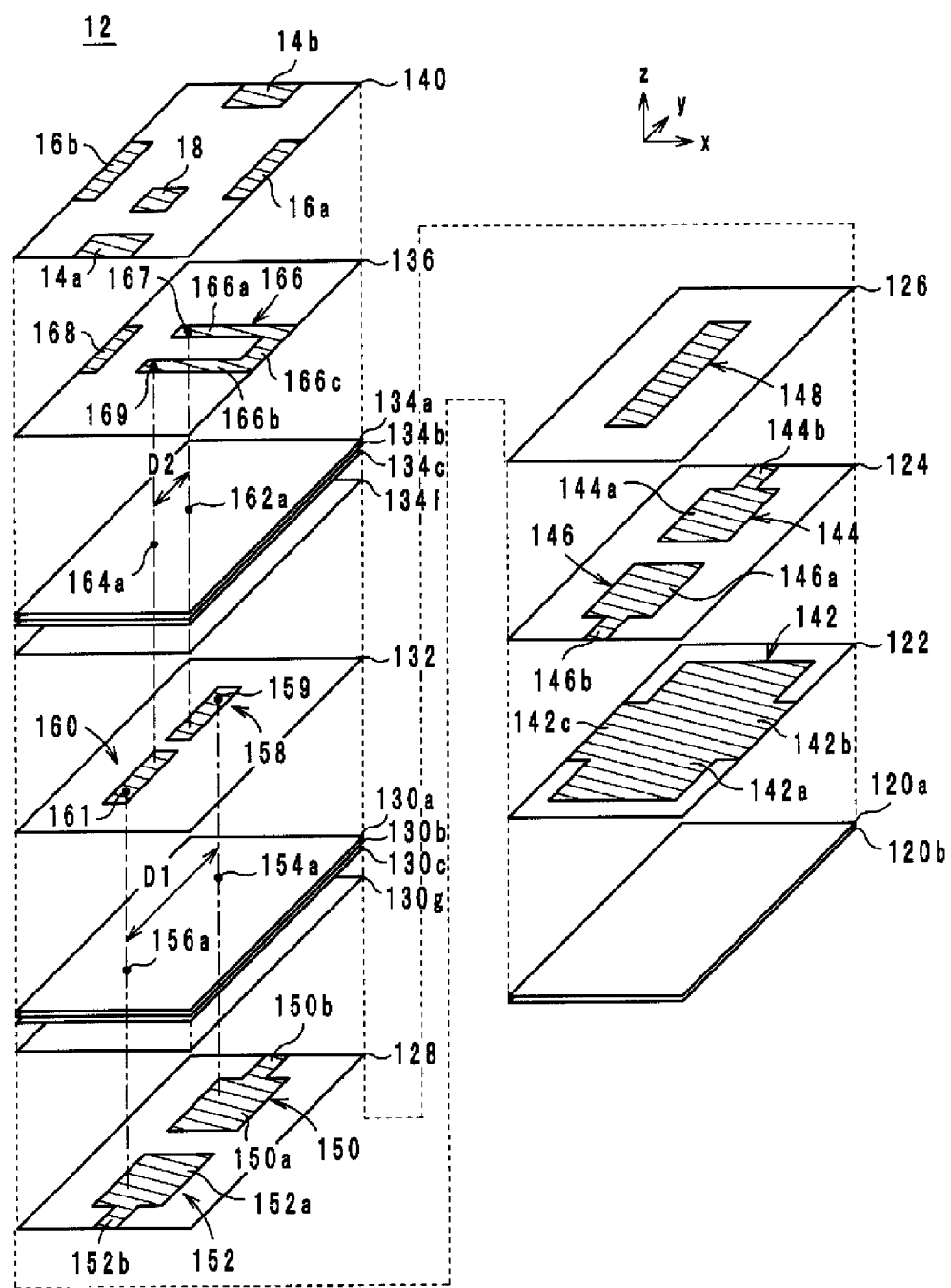
FIG. 10 is an exploded perspective view of the laminate included in the multilayer electronic component illustrated in FIG. 9A.
Figure 11:
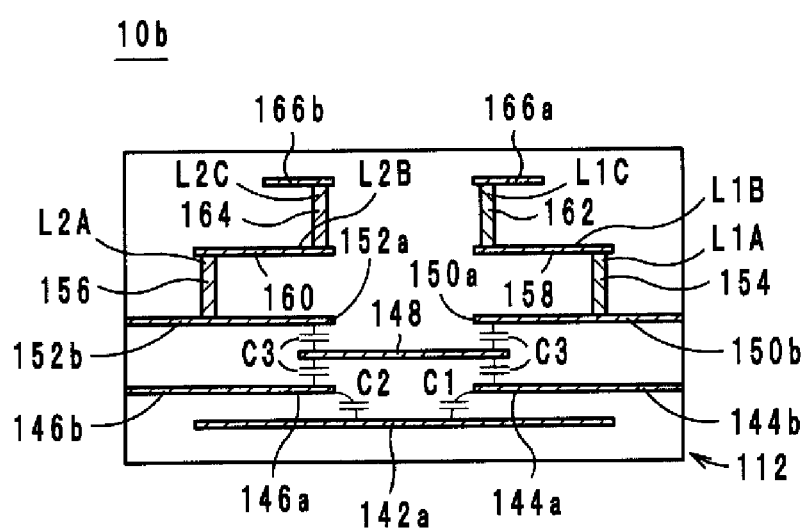
FIG. 11 is a cross-sectional view of the multilayer electronic component taken along the line A-A of FIG. 9A.

A multilayer electronic component according to a second preferred embodiment of the present invention will be described below with reference to the accompanying drawings. FIGS. 9A and 9B are external perspective views of a multilayer electronic component 10b according to the second preferred embodiment. More specifically, FIG. 9A is a diagram illustrating the multilayer electronic component 10b as viewed from the upper surface of the multilayer electronic component 10b. FIG. 9B is a diagram illustrating the multilayer electronic component 10b as viewed from the undersurface of the multilayer electronic component 10b. FIG. 10 is an exploded perspective view of the laminate 12 included in the multilayer electronic component 10b. FIG. 11 is a cross-sectional view of the multilayer electronic component 10b taken along the line A-A illustrated of FIG. 9A. As illustrated in FIGS. 9A and 9B, a widthwise direction on the upper surface of the multilayer electronic component 10b is hereinafter referred to as an x-axis direction, a lengthwise direction on the upper surface of the multilayer electronic component 10b is hereinafter referred to as a y-axis direction, and a lamination direction of the multilayer electronic component 10b is hereinafter referred to as a z-axis direction. FIG. 3 is also used as the equivalent circuit diagram of the multilayer electronic component 10b.

First, the external view of the multilayer electronic component 10b will be described with reference to FIGS. 9A and 9B. The multilayer electronic component 10b includes the laminate 12, the input external electrode 14a, the output external electrode 14b, the ground external electrodes 16a and 16b, and the orientation recognition mark 18. The laminate 12 is formed by laminating a plurality of insulating layers, and is preferably a rectangular or substantially rectangular parallelepiped. In the laminate 12, a plurality of capacitors (not illustrated) and a plurality of inductors (not illustrated) are formed. The input external electrode 14a is provided on an end surface located at an end portion of the laminate 12 in the y-axis direction, and functions as a terminal for receiving a signal. The output external electrode 14b is provided on an end surface facing the end surface on which the input external electrode 14a is provided, and functions as a terminal for outputting a signal.

The ground external electrode 16a is provided on a side surface located at an end portion of the laminate 12 in the x-axis direction. The ground external electrode 16b is provided on a side surface facing the side surface on which the ground external electrode 16a is formed. The orientation recognition mark 18 is formed on the upper surface of the laminate 12, and is used to recognize the orientation of the multilayer electronic component 10b.

Next, the inner structure of the laminate 12 will be described with reference to FIGS. 10 and 11. As illustrated in FIG. 10, in the laminate 12, insulating layers 140, 136, 134a to 134f, 132, 130a to 130g, 128, 126, 124, 122, 120a, and 120b are laminated so that these insulating layers are arranged in this order from top to bottom (the insulating layers 130d to 130f, 134d, and 134e are not illustrated). If the insulating layers 130a to 130g and 134a to 134f are referred to individually, then the insulating layers 130a to 130g and 134a to 134f are used. If the insulating layers 130a to 130g and the insulating layers 134a to 134f are referred to collectively, then the insulating layers 130 and 134 are used, respectively.

No component is formed or provided on the main surfaces of the insulating layers 120a and 120b. An internal electrode 142 is provided on the main surface of the insulating layer 122. The internal electrode 142 includes a capacitor electrode 142a and extraction electrodes 142b and 142c. The capacitor electrode 142a is preferably a rectangular or substantially rectangular electrode formed on the main surface of the insulating layer 122, and functions as an electrode of the capacitors C1 and C2 as illustrated in FIGS. 3 and 11. One end of the extraction electrode 142b is connected to the capacitor electrode 142a, and the other end of the extraction electrode 142b is connected to the ground external electrode 16a illustrated in FIGS. 9A and 9B. One end of the extraction electrode 142c is connected to the capacitor electrode 142a, and the other end of the extraction electrode 142c is connected to the ground external electrode 16b illustrated in FIGS. 9A and 9B. Therefore, the internal electrode 142 also functions as a ground electrode.

Internal electrodes 144 and 146 are provided on the main surface of the insulating layer 124. The internal electrode 144 includes a capacitor electrode 144a and an extraction electrode 144b. The capacitor electrode 144a is preferably a rectangular or substantially rectangular electrode arranged on the main surface of the insulating layer 124 so that it faces the capacitor electrode 142a, and functions as the other electrode of the capacitor C1 as illustrated in FIGS. 3 and 11. Furthermore, the capacitor electrode 144a also functions as an electrode of the capacitor C3. One end of the extraction electrode 144b is connected to the capacitor electrode 144a, and the other end of the extraction electrode 144b is connected to the output external electrode 14b illustrated in FIGS. 9A and 9B.

The internal electrode 146 includes a capacitor electrode 146a and an extraction electrode 146b. The capacitor electrode 146a is preferably a rectangular or substantially rectangular electrode arranged on the main surface of the insulating layer 124 so that it faces the capacitor electrode 142a, and functions as the other electrode of the capacitor C2 as illustrated in FIGS. 3 and 11. Furthermore, the capacitor electrode 146a also functions as the other electrode of the capacitor C3. That is, the capacitor electrodes 144a and 146a form the capacitor C3. One end of the extraction electrode 146b is connected to the capacitor electrode 146a, and the other end of the extraction electrode 146b is connected to the input external electrode 14a illustrated in FIGS. 9A and 9B.

An internal electrode (capacitor electrode) 148 is provided on the main surface of the insulating layer 126. The capacitor electrode 148 is preferably a rectangular or substantially rectangular electrode arranged on the main surface of the insulating layer 126 so that it faces the capacitor electrodes 144a and 146b, and functions as a portion of the capacitor C3 as illustrated in FIGS. 3 and 11.

Internal electrodes 150 and 152 are provided on the main surface of the insulating layer 128. The internal electrode 150 includes a capacitor electrode 150a and an extraction electrode 150b. The capacitor electrode 150a is preferably a rectangular or substantially rectangular electrode provided on the main surface of the insulating layer 128, and functions as an electrode of the capacitor C3 as illustrated in FIGS. 3 and 11. One end of the extraction electrode 150b is connected to the capacitor electrode 150a, and the other end of the extraction electrode 150b is connected to the output external electrode 14b illustrated in FIGS. 9A and 9B.

The internal electrode 152 includes a capacitor electrode 152a and an extraction electrode 152b. The capacitor electrode 152a is preferably a rectangular or substantially rectangular electrode provided on the main surface of the insulating layer 128, and functions as the other electrode of the capacitor C3 as illustrated in FIGS. 3 and 11. That is, the capacitor electrodes 150a and 152a define the capacitor C3. One end of the extraction electrode 152b is connected to the capacitor electrode 152a, and the other end of the extraction electrode 152b is connected to the input external electrode 14a illustrated in FIGS. 9A and 9B.

In the insulating layers 130a to 130g, via-hole conductors 154a to 154g and via-hole conductors 156a to 156g are formed, respectively (the via-hole conductors 154b to 154g and 156b to 156g are not illustrated). Via-hole conductors 159 and 161 are formed in the insulating layer 132. By laminating the insulating layers 130a to 130g and 132, the via-hole conductors 154a to 154g and 159 are formed as a first interlayer connection conductor extending in the lamination direction in the laminate and function as the inductor L1A as illustrated in FIGS. 3 and 11. By laminating the insulating layers 130a to 130g and 132, the via-hole conductors 156a to 156g and 161 are formed as a third interlayer connection conductor extending in the lamination direction in the laminate 12 and function as the inductor L2A as illustrated in FIGS. 3 and 11. By laminating the insulating layers 128 and 130g, the via-hole conductors 154g and 156g are directly connected to the capacitor electrodes 150a and 152a, respectively. To refer to via-hole conductors formed on the insulating layers 130a to 130g, the via-hole conductors 154a to 154g and the via-hole conductors 156a to 156g are used, respectively. In order to refer to a via-hole conductor obtained by connecting the via-hole conductors 154a to 154g and 159 to each other and a via-hole conductor obtained by connecting the via-hole conductors 156a to 156g and 161 to each other, via-hole conductors 154 and 156 are used, respectively.

Furthermore, the via-hole conductors 154a to 154g and 159 and the via-hole conductors 156a to 156g and 161 are formed on the insulating layers 130a to 130g and 132 so that they are spaced apart from each other by the first distance D1, respectively. In the insulating layers 130a to 130g, only the via-hole conductors 154a to 154g and only the via-hole conductors 156a to 156g are respectively formed. The insulating layers 130a to 130g are members preferably having the same structure.

Internal electrodes 158 and 160 are provided on the main surface of the insulating layer 132. The internal electrode 158 is preferably a rectangular or substantially rectangular electrode provided on the main surface of the insulating layer 132, and is connected to the via-hole conductor 159. The internal electrode 160 is preferably a rectangular or substantially rectangular electrode provided on the main surface of the insulating layer 132, and is connected to the via-hole conductor 161. As illustrated in FIGS. 3 and 11, the internal electrodes 158 and 160 are used to shift the positions of the inductors L1C and L2C electrically connected to the inductors L1A and L2A so that the inductors L1C and L2C and the inductors L1A and L2A are not respectively aligned in the x-y plane. As illustrated in FIGS. 3 and 11, the internal electrodes 158 and 160 also function as the inductors L1B and L2B, respectively.

In the insulating layers 134a to 134f, via-hole conductors 162a to 162f and via-hole conductors 164a to 164f are formed, respectively (the via-hole conductors 162b to 162f and 164b to 164f are not illustrated). Via-hole conductors 167 and 169 are formed in the insulating layer 136. The insulating layers 134a to 134f are members preferably having the same or substantially the same structure. By laminating the insulating layers 134a to 134f and 136, the via-hole conductors 162a to 162f and 167 are formed as a second interlayer connection conductor extending in the lamination direction in the laminate 12 and function as the inductor L1C. By laminating the insulating layers 134a to 134f and 136, the via-hole conductors 164a to 164f and 169 are formed as a fourth interlayer connection conductor extending in the lamination direction in the laminate 12 and function as the inductor L2C. By laminating the insulating layers 134f and 132, the via-hole conductors 162f and 164f are connected to the internal electrodes 158 and 161, respectively. In order to refer to via-hole conductors formed on the insulating layers 134a to 134f, the via-hole conductors 162a to 162f and the via-hole conductors 164a to 164f are used, respectively. In order to refer to a via-hole conductor obtained by connecting the via-hole conductors 162a to 162f and 167 to each other and a via-hole conductor obtained by connecting the via-hole conductors 164a to 164f and 169 to each other, via-hole conductors 162 and 164 are used, respectively.

Furthermore, the via-hole conductors 162a to 162f and 167 and the via-hole conductors 164a to 164f and 169 are formed on the insulating layers 134a to 134f and 136 so that they are spaced apart from each other by the second distance D2 that is preferably shorter than the first distance D1, respectively. In the insulating layers 134a to 134f, only the via-hole conductors 162a to 162f and only the via-hole conductors 164a to 164f are formed, respectively.

Internal electrodes 166 and 168 are provided on the main surface of the insulating layer 136. The internal electrode 166 includes inductor electrodes 166a and 166b and an extraction electrode 166c, and functions as a common electrode. Each of the inductor electrodes 166a and 166b is preferably a rectangular or substantially rectangular electrode provided on the main surface of the insulating layer 136, and functions as the inductor L3 along with the ground external electrode 16b. One end of each of the inductor electrodes 166a and 166b are connected to the via-hole conductors 167 and 169, respectively. As a result, the inductors L1C and L2C are electrically connected to each other via the internal electrode 166. Ends of the extraction electrodes 166c are connected to the inductor electrodes 166a and 166b, and the other end of the extraction electrode 166c is connected to the ground external electrode 16a.

The internal electrode 168 is arranged along a side facing a side at which the extraction electrode 166c is located. The internal electrode 168 is arranged so that it is spaced apart from the inductor electrodes 166a and 166b by a predetermined distance, and one end of the internal electrode 168 is connected to the ground external electrode 16b.

The orientation recognition mark 18 and portions of the input external electrode 14a, the output external electrode 14b, and the ground external electrodes 16a, 16b are formed on the insulating layer 140.

By laminating the insulating layers 120a, 120b, 122, 124, 126, 128, 130a to 130g, 132, 134a to 134f, 136, and 140 having the above-described structure, the multilayer electronic component 10b having an equivalent circuit illustrated in FIG. 3 and a cross section structure illustrated in FIG. 11 is obtained. The multilayer electronic component 10b having the above-described structure can provide the same operational effect as that of the multilayer electronic component 10*a*.

The equivalent circuit of the multilayer electronic component 10*b* is the same or substantially the same as that of the multilayer electronic component 10, and the description thereof will be therefore omitted. Furthermore, a method of manufacturing the multilayer electronic component 10*b* is substantially the same as the method of manufacturing the multilayer electronic component 10, and the description thereof will be therefore omitted.

As described above, preferred embodiments of the present invention are useful for a multilayer electronic component and a multilayer electronic component manufacturing method, and, in particular, have an advantage in its suitability for easily controlling the degree of magnetic field coupling between inductors.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component comprising:
   a first resonance circuit including a first capacitor, a first conductor, and a second conductor;
   a second resonance circuit including a second capacitor, a third conductor, and a fourth conductor; wherein
   the first and third conductors are arranged to generate a first mutual inductance therebetween;
   the second and fourth conductors are arranged to generate a second mutual inductance therebetween;
   the first mutual inductance is different from the second mutual inductance; and
   the first conductor includes a first via-hole conductor and the second conductor includes a second via-hole conductor.

2. The electronic component according to claim 1, further comprising:
   a third capacitor arranged to couple the first and second resonance circuits to each other.

3. The electronic component according to claim 1, wherein
   the first and third conductors are spaced apart from each other by a first distance;
   the second and fourth conductors are spaced apart from each other by a second distance; and
   the first and second distances are different from one other so as to generate the different first and second mutual inductances.

4. The electronic component according to claim 1, wherein the first and second conductors defines a first inductor, and the third and fourth conductors define a second inductor.

5. The electronic component according to claim 1, wherein the first resonance circuit includes the first capacitor and at least two inductors connected in parallel.

6. The electronic component according to claim 5, wherein the at least two inductors of the first resonance circuit are not aligned with each other in an x-y plane.

7. The electronic component according to claim 1, wherein the second resonance circuit includes the second capacitor and at least two inductors connected in parallel.

8. The electronic component according to claim 7, wherein the at least two inductors of the second resonance circuit are not aligned with each other in an x-y plane.

9. The electronic component according to claim 1, further comprising an inductor including a first end connected to the first resonance circuit and to the second resonance circuit.

10. The electronic component according to claim 9, wherein the inductor includes a second end connected to ground.

11. The electronic component according to claim 1, wherein the first resonance circuit and the second resonance circuit are coupled to each other by magnetic field coupling provided by the first mutual inductance and the second mutual inductance.

12. The electronic component according to claim 1, wherein the first resonance circuit and the second resonance circuit are coupled to each other by magnetic field coupling determined by lengths of the first and second via-hole conductors and a distance between the first and second via-hole conductors.

13. The electronic component according to claim 1, wherein the electronic component is a band-pass filter.

14. An electronic component comprising:
    a first resonance circuit including at least first and second inductors;
    a second resonance circuit including at least third and fourth inductors; wherein
    the first and second resonance circuits are magnetically coupled to each other by a first mutual inductance generated between the first and third inductors and a second mutual inductance generated between the second and fourth inductors, and the first mutual inductance is different from the second mutual inductance; and
    the first inductor includes a first via-hole conductor and the second inductor includes a second via-hole conductor.

15. The electronic component according to claim 14, wherein the first resonance circuit includes a first capacitor, the second resonance circuit includes a second capacitor, and the electronic component includes a third capacitor arranged to couple the first and second resonance circuits to each other.

16. The electronic component according to claim 14, wherein the first resonance circuit includes first and second conductors, the second resonance circuit includes third and fourth conductors, the first and third conductors are spaced apart from each other by a first distance, the second and fourth conductors are spaced apart from each other by a second distance, and the first and second distances are different from one other so as to generate the different first and second mutual inductances.

17. The electronic component according to claim 14, wherein the first and second inductors of the first resonance circuit are not aligned with each other in an x-y plane.

18. The electronic component according to claim 14, wherein the third and fourth inductors of the second resonance circuit are not aligned with each other in an x-y plane.

19. The electronic component according to claim 14, wherein the multilayer electronic component is a band-pass filter.

* * * * *